United States Patent [19]
Fillion et al.

[11] Patent Number: 5,353,195
[45] Date of Patent: Oct. 4, 1994

[54] INTEGRAL POWER AND GROUND STRUCTURE FOR MULTI-CHIP MODULES

[75] Inventors: Raymond A. Fillion, Niskayuna; Robert J. Wojnarowski, Ballston Lake, both of N.Y.

[73] Assignee: General Electric Company, Schenectady, N.Y.

[21] Appl. No.: 87,433

[22] Filed: Jul. 9, 1993

[51] Int. Cl.$^5$ .............................................. H05K 7/02
[52] U.S. Cl. ..................... 361/760; 361/729; 361/748; 361/799; 361/810; 174/255; 257/700
[58] Field of Search ............... 361/729, 736, 748, 749, 361/750, 760, 761, 767, 784, 792, 799, 807, 810; 174/52.4, 255, 261; 257/686, 700; 29/830

[56] References Cited

U.S. PATENT DOCUMENTS

| | | | |
|---|---|---|---|
| 4,613,891 | 9/1986 | Ng et al. | 357/68 |
| 4,783,695 | 11/1988 | Eichelberger et al. | 357/65 |
| 4,835,704 | 5/1989 | Eichelberger et al. | |
| 4,878,991 | 11/1989 | Eichelberger et al. | |
| 4,894,115 | 1/1990 | Eichelberger et al. | |
| 4,933,042 | 6/1990 | Eichelberger et al. | |
| 5,154,793 | 10/1992 | Wojnarowski et al. | |
| 5,166,772 | 11/1992 | Soldner et al. | 257/659 |
| 5,172,303 | 12/1992 | Bernardoni et al. | 361/396 |

*Primary Examiner*—Gerald P. Tolin
*Assistant Examiner*—Young Whang
*Attorney, Agent, or Firm*—Geoffrey H. Krauss

[57] ABSTRACT

A multi-chip module includes a substrate supporting a plurality of chips. A dielectric layer which overlies the chips and the substrate has a connection surface and a substrate surface with metallization planes having plane openings patterned on each surface and vias aligned with predetermined pads on the chips and predetermined portions of the metallization plane of the substrate surface. An adhesive layer is situated between the substrate and the substrate surface of the dielectric layer, and a pattern of electrical conductors extends through the vias to interconnect selected chips and selected portions of the metallization planes. In a related design, the dielectric layer may be a board having chip openings and conductive through-connections aligned with predetermined portions of the metallization plane of the substrate surface. The board can be thick enough that chip wells are not necessary for each chip, in which case, a base dielectric layer having vias aligned with chip pads, through-connections and the connection surface overlies the board and supports a pattern of electrical conductors which interconnect the chips and metallization planes.

19 Claims, 8 Drawing Sheets

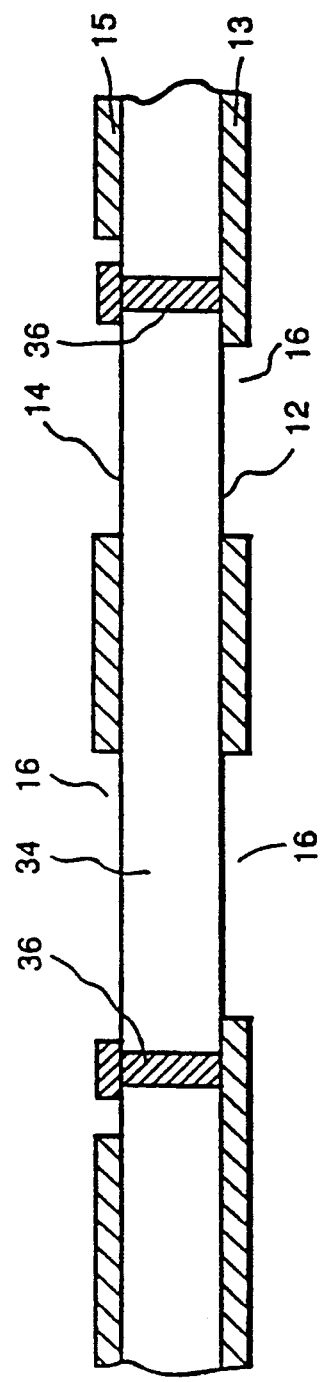
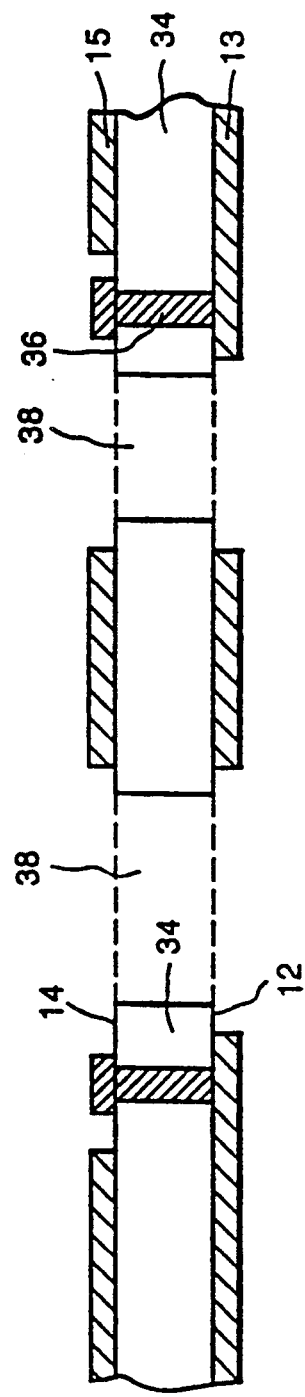
FIG. 7
FIG. 8

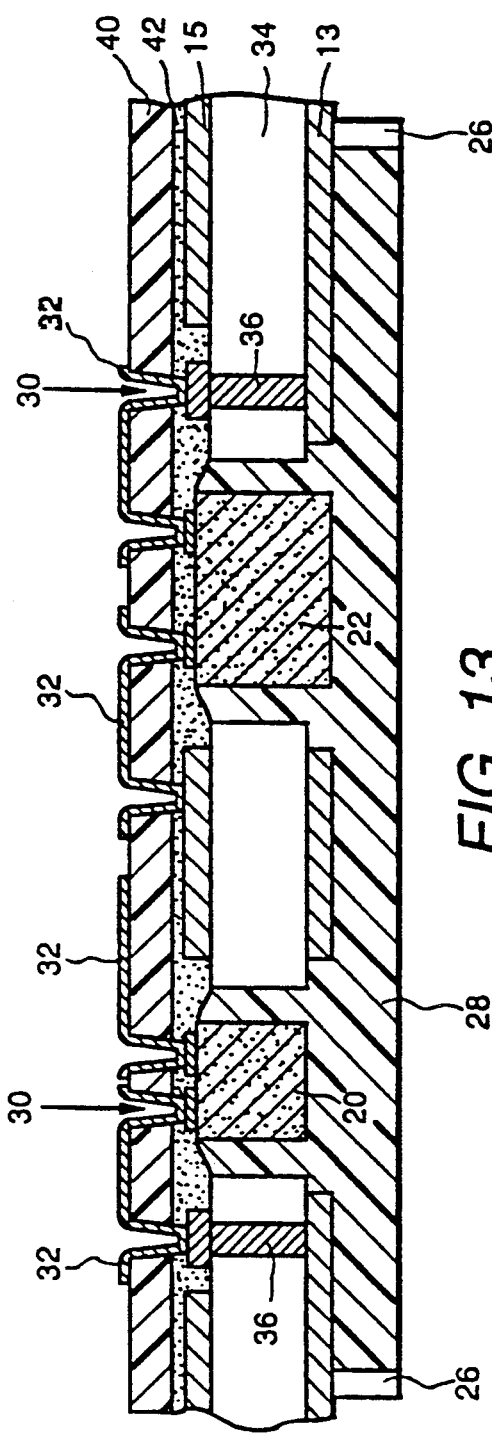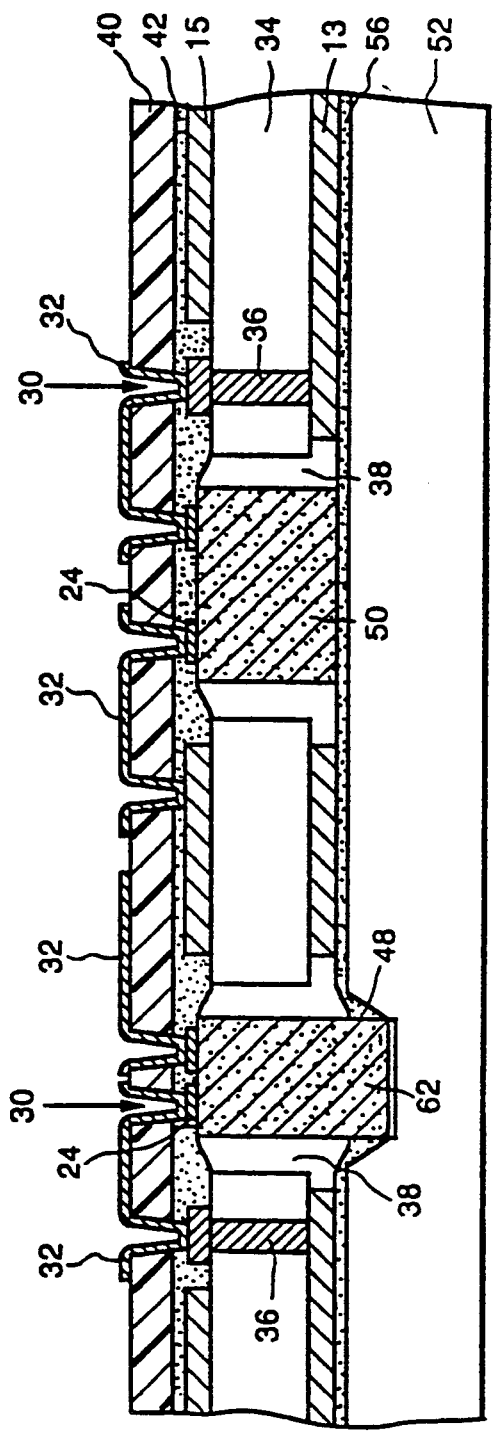

INTEGRAL POWER AND GROUND STRUCTURE FOR MULTI-CHIP MODULES

CROSS REFERENCE TO RELATED APPLICATION

This application is related to the following co-pending application which is assigned to a common assignee and is incorporated herein by reference: Fillion et al., "Embedded Substrate for Multi-Chip Modules," U.S. Pat. No. 5,353,498 filed concurrently herewith, which is a continuation in part of application Ser. No. 08/014,481, filed Feb. 8, 1993.

BACKGROUND OF THE INVENTION

Field of the Invention

This invention relates generally to multi-chip modules and their fabrication, and, more particularly, to a chip connection layer having integral power and ground planes.

Description of the Related Art

In the packaging of very large scale integrated circuit chips, much space is taken up by connections between integrated circuit (IC) chips and adjacent chips and/or other circuit components. This makes the packaging of integrated circuit chips and electronic components based thereon larger than necessary. As a result of this, many approaches have been taken toward development of so-called wafer scale integration processes. However, the efforts expended in these directions have generally resulted in limited yield. Because a number of chips or dies on a wafer are often found to be defective, the number of wafers produced that are completely usable is generally lower than desired. Accordingly, an approach that would enable construction of wafer scale integrated circuit packages from individual, easily testable integrated circuit chips would be desirable.

In prior high density interconnect (HDI) techniques, a polymer film overlay covers a plurality of integrated circuit chips adjacent to one another on an underlying substrate. The polymer film provides an insulated layer upon which is deposited a metallization pattern for interconnection of individual circuit chips. A significant advantage of those embodiments is the ability to remove one or more of the interconnection layers so as to provide various arrangement and testing capabilities.

Methods for performing a HDI process using overlays are described in Eichelberger et al., U.S. Pat. No. 4,783,695, issued Nov. 8, 1988, and in Eichelberger et al., U.S. Pat. No. 4,933,042, issued Jun. 12, 1990, both of which are commonly assigned and hereby incorporated by reference. Additionally, it is desirable to provide via openings or apertures in the polymer film overlay so as to be able to provide electrical connection between various parts of a chip or between several chips. Commonly assigned Eichelberger et al., U.S. Pat. No. 4,894,115, issued Jan. 16, 1990, which is hereby incorporated herein by reference, discloses embodiments for providing such apertures. Furthermore, methods for gaining access to and replacing a defective integrated circuit chip are disclosed in Eichelberger et al., U.S. Pat. No. 4,878,991, issued Nov. 7, 1989, and Wojnarowski et al., U.S. Pat. No. 5,154,793, issued Oct. 13, 1992, which are commonly assigned and hereby incorporated by reference.

In prior interconnection techniques, chip wells are often mechanically milled into substrates. Aforementioned Fillion et al., U.S. Pat. No. 5,353,498 discloses a method of fabricating an HDI substrate by molding plastic around chips placed on a film, thus eliminating the milling process and providing a planar surface without moats between chips and the substrate. The time and expense involved in fabricating modules of this configuration is proportional to the area of the substrate and the number of layers of interconnection. Power and ground lines typically require separate layers of interconnection. Thus it would be desirable to have an integral power and ground structure for reducing module processing steps.

SUMMARY OF THE INVENTION

Accordingly, an object of the invention is to reduce processing steps for fabrication of power and ground planes in an HDI multi-chip module.

Briefly, according to a preferred embodiment of the invention, a multi-chip module comprises a module substrate, and a plurality of chips supported thereon and including chip pads. A dielectric layer which overlies the chips and the substrate has both a connection surface and a substrate surface, with a metallization plane having plane openings patterned on each respective surface and vias aligned with predetermined chip pads and predetermined portions of the metallization plane of the substrate surface. Adhesive is situated between the module substrate and the substrate surface of the dielectric layer, and a pattern of electrical conductors extends through the vias to interconnect selected chips and selected portions of the metallization planes.

According to another preferred embodiment of the invention, a multi-chip module comprises a module substrate having a board layer with chip openings, a connection surface and a substrate surface, with a metallization plane having plane openings patterned on each respective surface, and conductive through-connections aligned with predetermined portions of the metallization plane of the substrate surface. Adhesive is situated between the module substrate and the substrate surface of the board layer. At least one of a plurality of chips having chip pads thereon is situated in a respective one of the chip openings. Selected chip pads are coupled to portions of the metallization planes.

According to another embodiment of the invention, a method of fabricating a multi-chip module on a base comprises applying a dielectric layer over the base, the dielectric layer having a connection surface and a substrate surface, with a metallization plane having plane openings patterned on each respective surface, A plurality of chips having chip pads thereon are placed face down on the dielectric layer through the openings in the substrate surface of the dielectric layer with at least one of the chips situated in a respective one of the openings. A mold form is positioned around the chips, and substrate molding material is added and then hardened within the mold form. The dielectric layer is then separated from the base, and vias are formed through the dielectric layer aligned with predetermined chip pads and predetermined portions of the metallization plane of the substrate surface. The chip pads are coupled to the metallization planes. In a related embodiment, the dielectric layer is applied to a preformed substrate having chip wells containing chips.

According to another embodiment of the invention, a method of fabricating a multi-chip module on a base comprises applying a board layer over the base, the board layer has chip openings, a connection surface and a substrate surface, with a metallization plane having plane openings patterned on each respective surface, and through-connections aligned with predetermined portions of the metallization plane of the substrate surface extending though the board layer. A plurality of chips having chip pads are placed face down on the base through the chip openings, and a mold form is positioned around the chips. Substrate molding material is added and then hardened within the mold form. The board layer and the chips are separated from the base, and the chip pads and the metallization planes are coupled. In a related embodiment, the board layer is applied to a preformed substrate and chips are then inserted face up into the chip openings before being interconnected with the metallization planes.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

FIG. 7 is a sectional side view of a board layer having two surfaces covered by patterned metallization planes;

FIG. 8 is a view similar to that of FIG. 7, further showing openings in the board layer;

FIG. 13 is a view similar to that of FIG. 12, further showing vias in the base dielectric layer and a pattern of electrical conductors interconnecting the chip pads with the metallization planes; and FIG. 13(a) is a view similar to that of FIG. 13, showing a substrate having a chip well in which a chip is situated.

DETAILED DESCRIPTION OF A PREFERRED EMBODIMENT OF THE INVENTION

Figure 1:
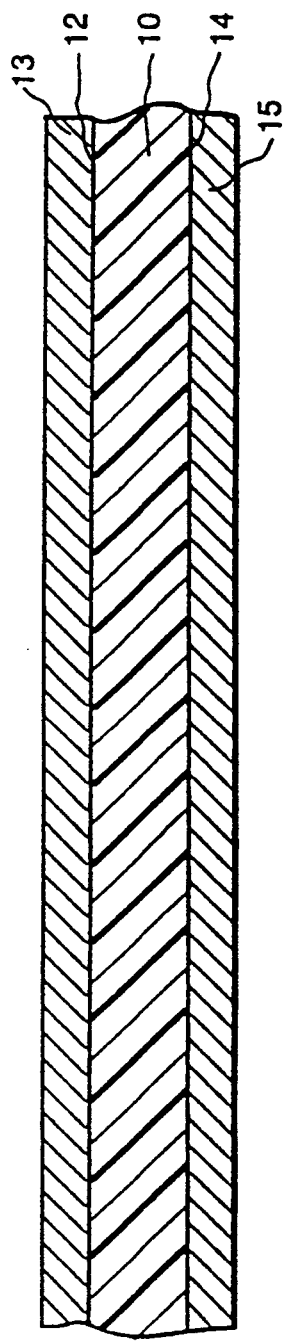
FIG. 1 is a sectional side view of a dielectric layer having two surfaces covered by metallization planes to form a connection layer.

FIG. 1 is a sectional side view of a dielectric layer 10 having two surfaces, shown as a substrate surface 12 and a connection surface 14, covered by respective metallization planes 13 and 15. In one embodiment dielectric layer 10 is a film comprising a polymer such as Kapton polyimide (Kapton is a trademark of E.I. dupont de Nemours and Co.) having a thickness ranging from 0.5 to 2.0 mils. The metallization planes can comprise a single metal such as copper or a composite structure such as titanium:copper:titanium and preferably have a thickness ranging from 1 to 10 $\mu$m.

Figure 2:
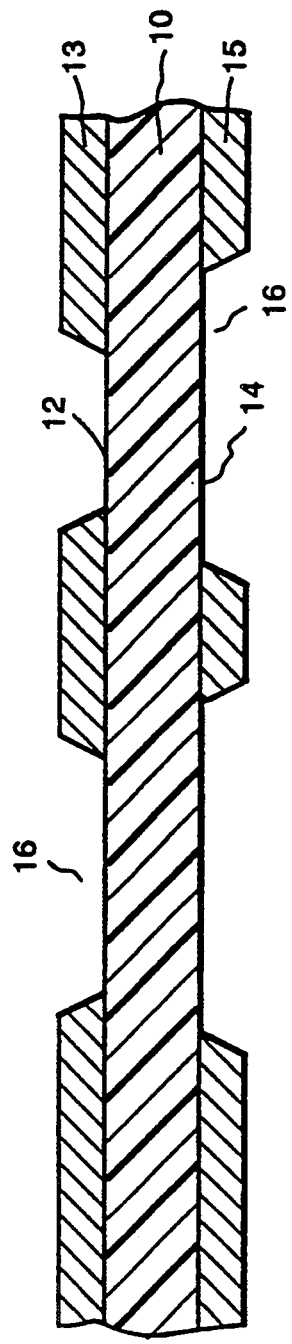
FIG. 2 is a view similar to that of FIG. 1, further showing openings in the metallization planes.

FIG. 2 shows the dielectric layer of FIG. 1 with openings 16 in metallization planes 13 and 15. The process for selectively removing metallization in predetermined areas of the structure shown in FIG. I can include, for example, etching the unwanted metal through a patterned photoresist. The metal pattern is designed so that the openings in the metallization planes are situated Where the chips (shown in FIG. 4 as chips 20 and 22) are to be located, and there are correspondingly broader openings on the metallization plane of connection surface 14. Patterning of these planes is preferably within 5 to 15 mils tolerance.

Figure 3:
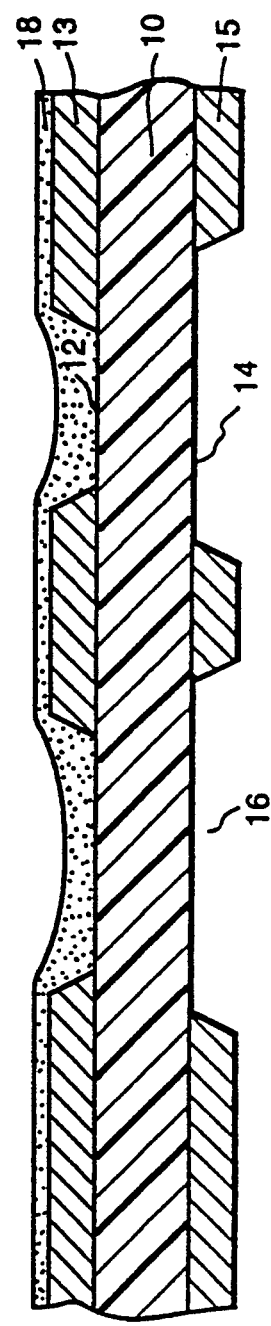
FIG. 3 is a view similar to that of FIG. 2, further showing the addition of an adhesive to one surface of the dielectric layer.

FIG. 3 shows the structure of FIG. 2 with the addition of an adhesive 18 to substrate surface 12 and metallization plane 13 of dielectric layer 10. The adhesive can comprise any thermoset or thermoplastic polymer which meets the thermal and bonding requirements of the HDI structure and of the circuit involved and can be applied by a process such as spin coating, spray coating, extruding, or using a preform. In one embodiment, the adhesive is Ultem polyetherimide (Ultem is a registered trademark of General Electric Co.). Preferably the adhesive thickness ranges from 5 to 20 $\mu$m.

Figure 4:
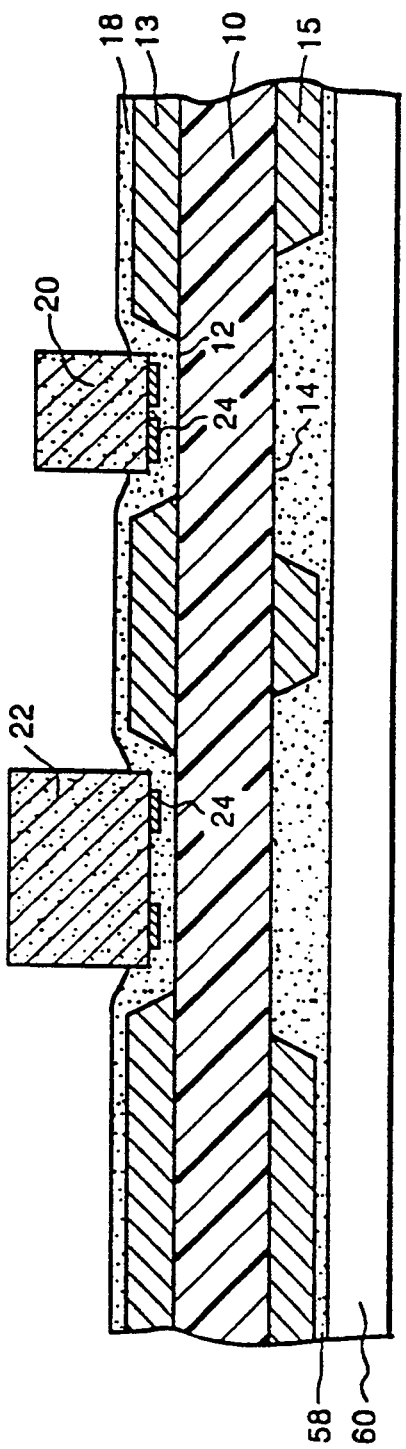
FIG. 4 is a view similar to that of FIG. 3, further showing chips situated in the adhesive over the openings.

FIG. 4 shows the structure of FIG. 3 with semiconductor chips 20 and 22 including chip pads 24 embedded in adhesive 18 over plane openings 16 of metallization plane 13 on the substrate surface 12 of dielectric layer 10. During fabrication, the dielectric layer is preferably supported on a base 60 coated with an adhesive 58. The chips need not be of uniform height and may comprise any electrical circuit components, including integrated circuits (ICs), and discrete devices, such as, for example, capacitors, resistors, inductors, and transducers. The chips may be placed in contact with the adhesive in any conventional manner. In one embodiment, a pick-and-place machine (not shown) is used.

Figure 5:
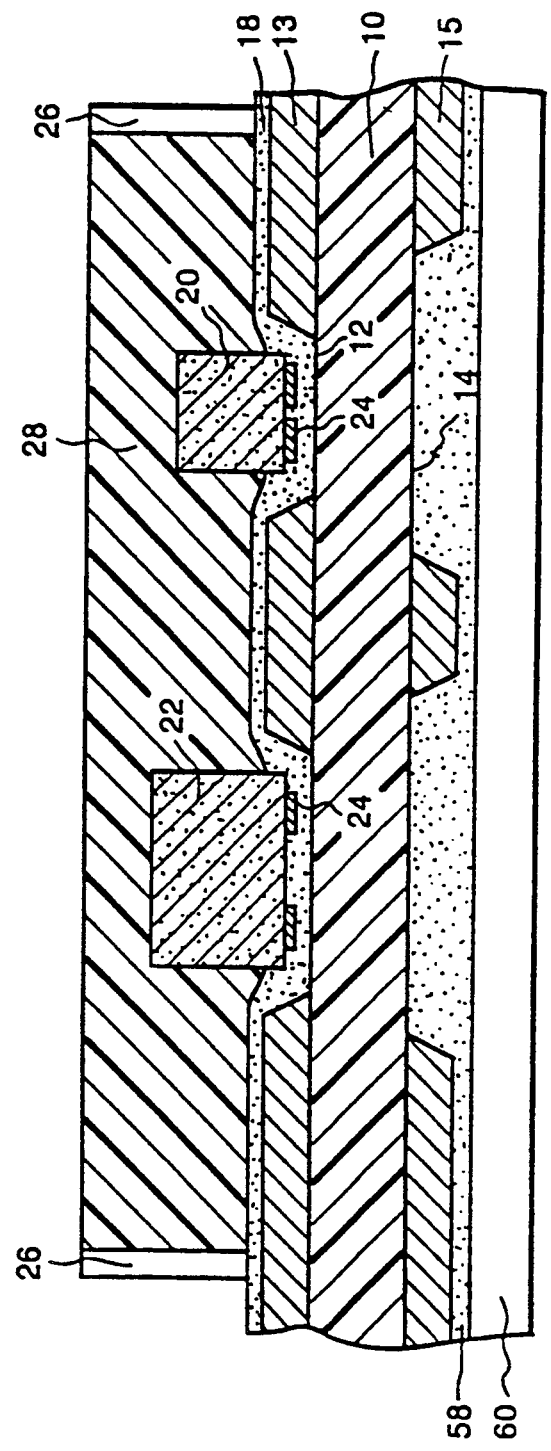
FIG. 5 is a view similar to that of FIG. 4, further showing a mold form situated around the chips and containing molding material.

FIG. 5 shows the structure of FIG. 4 with a mold form 26 situated around chips 20 and 22 and containing substrate molding material 28. The thickness of the molding material typically ranges from 20 to 80 mils. The molding material preferably comprises a thermoplastic or thermoset polymer, such as, for example, SPI(siloxane-polyimide)/epoxy or blends of Epon 828 (available from Shell Chemical), D.E.N. 438, D.E.R. 732 (D.E.N. and D.E.R. available from Dow Chemical) with appropriate catalyst or Ultem polyetherimide. Various molding processes are disclosed in aforementioned Fillion et al., Application Ser. No. After molding, the base can be removed from the substrate, chips, and dielectric layer, by removing the adhesive, as by using a chemical solvent such as MeCl$_2$ (methylene chloride) or NMP (N-methyl pyrrolidinone). The resulting structure is shown in FIG. 6.

Figure 6:
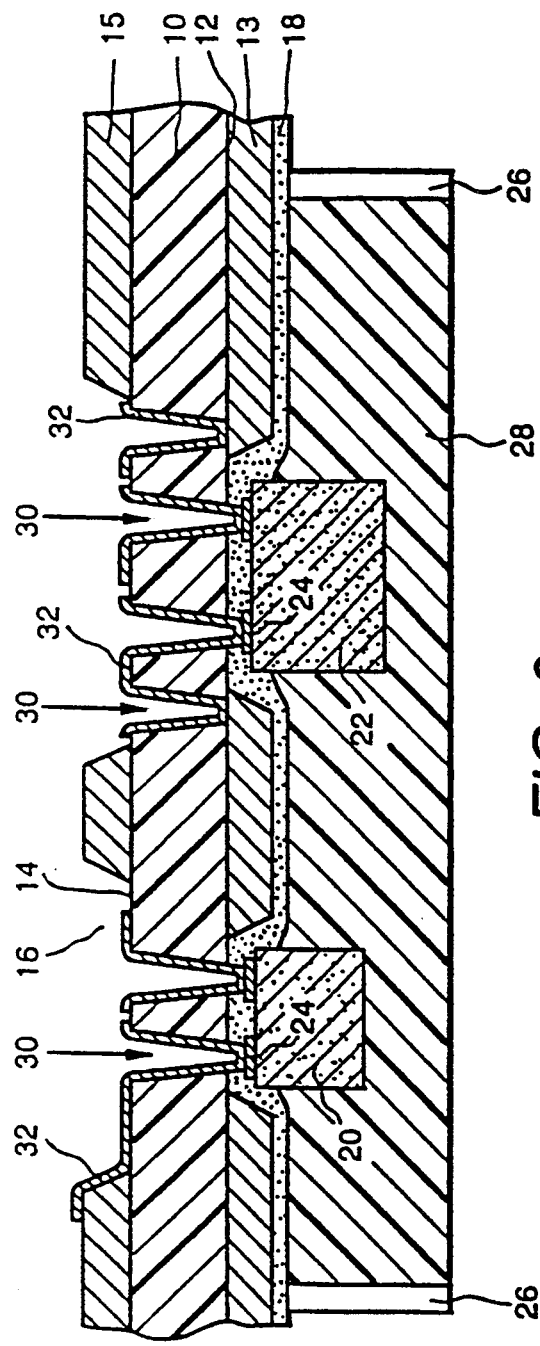
FIG. 6 is a view similar to that of FIG. 5, further showing the dielectric layer with the base removed, vias in the dielectric layer, and a pattern of electrical conductors interconnecting the chip pads and the metallization planes.

FIG. 6 shows vias 30 in dielectric layer 10 and a pattern of electrical conductors 32 interconnecting chip pads 24 with metallization planes 13 and 15. Vias 30 can be formed by using a laser or a mask etch process, with the preferred approach being that described in aforementioned U.S. Pat. No. 4,894,115. These vias are aligned with chip pads 24 and selected portions of metallization plane 13. The openings in metallization plane 15 should thus be smaller than the openings in plane 13. The pattern of electrical conductors 32 can be formed by sputtering or plating, for example, and patterned with a standard photoresist and etch process. Commonly assigned Eichelberger et al., U.S. Pat. No. 4,835,704, issued May 30, 1989, describes an adaptive lithography system for forming the interconnections and is herein incorporated by reference. The preferred interconnection material is copper having a composite structure of titanium:copper:titanium covered with a selected polymer dielectric such as SPI/epoxy to promote adhesion.

Figure 6A:
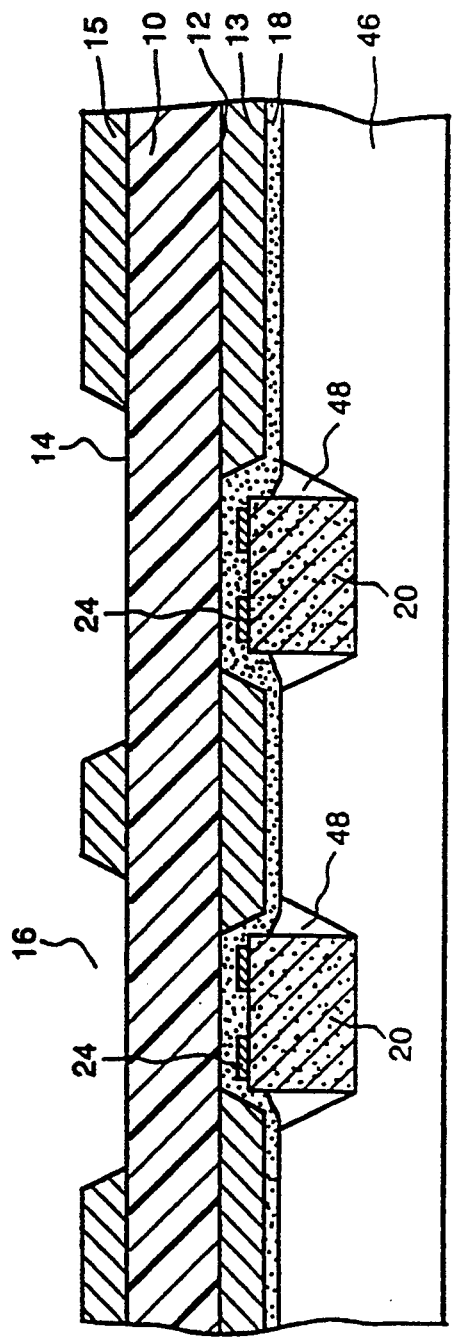
FIG. 6(a) is a view similar to that of FIG. 6, showing a substrate having chip wells in which chips are situated.

FIG. 6(a) illustrates, in a view similar to that of FIG. 6, a preformed substrate 46 having chip wells 48, resulting in air gaps between chips 20 and the substrate. Substrate 46 may comprise any appropriate structural material, and in one embodiment comprises a ceramic such as alumina. Chip wells can be provided by any conventional manner. The adhesive coated dielectric layer 10 shown in FIG. 3 is applied adhesive side down so that openings 16 of metallization plane 13 are positioned over the chips. Then vias and a pattern of electrical conductors (not shown) can be added as described with respect to the embodiment of FIG. 6.

FIG. 7 is a sectional side view of a board layer 34 which is similar to dielectric layer 10 as shown in FIG. 2. The board layer has two surfaces, shown as a substrate surface 12 and a connection surface 14, covered by respective metallization planes 13 and 15 having plane openings 16. Board layer 34 may comprise a prefabricated multi-layer ceramic board, a flex structure, glass epoxy, glass polyimide, Kevlar polyimide (Kevlar is a trademark of E.I. dupont de Nemours and Co.), or any other material with a reasonably low (for example, 3-6 PPM(parts per million)/°C.) coefficient of thermal expansion. The board thickness preferably ranges from 2.5 to 25 mils. The metallization planes preferably comprise copper and have thicknesses ranging between 0.2 and 2 mils. Electrically conductive through-connections 36 extend through the board from connection surface 14 to metallization plane 13 of substrate surface 12. The diameter of the through-connections preferably ranges from 2 to 20 mils. The through-connections may be solid pins or plated metallization in holes formed by, for example, mechanical milling, laser ablation, or a punch process.

FIG. 8 shows board layer 34 of FIG. 7 with chip openings 38 therein. In one embodiment the chip openings are formed by mechanically punching through the board layer. Preferably a chip opening is wider than the size of a chip (shown in FIG. 10) to be inserted by approximately 2 to 10 mils.

Figure 9:
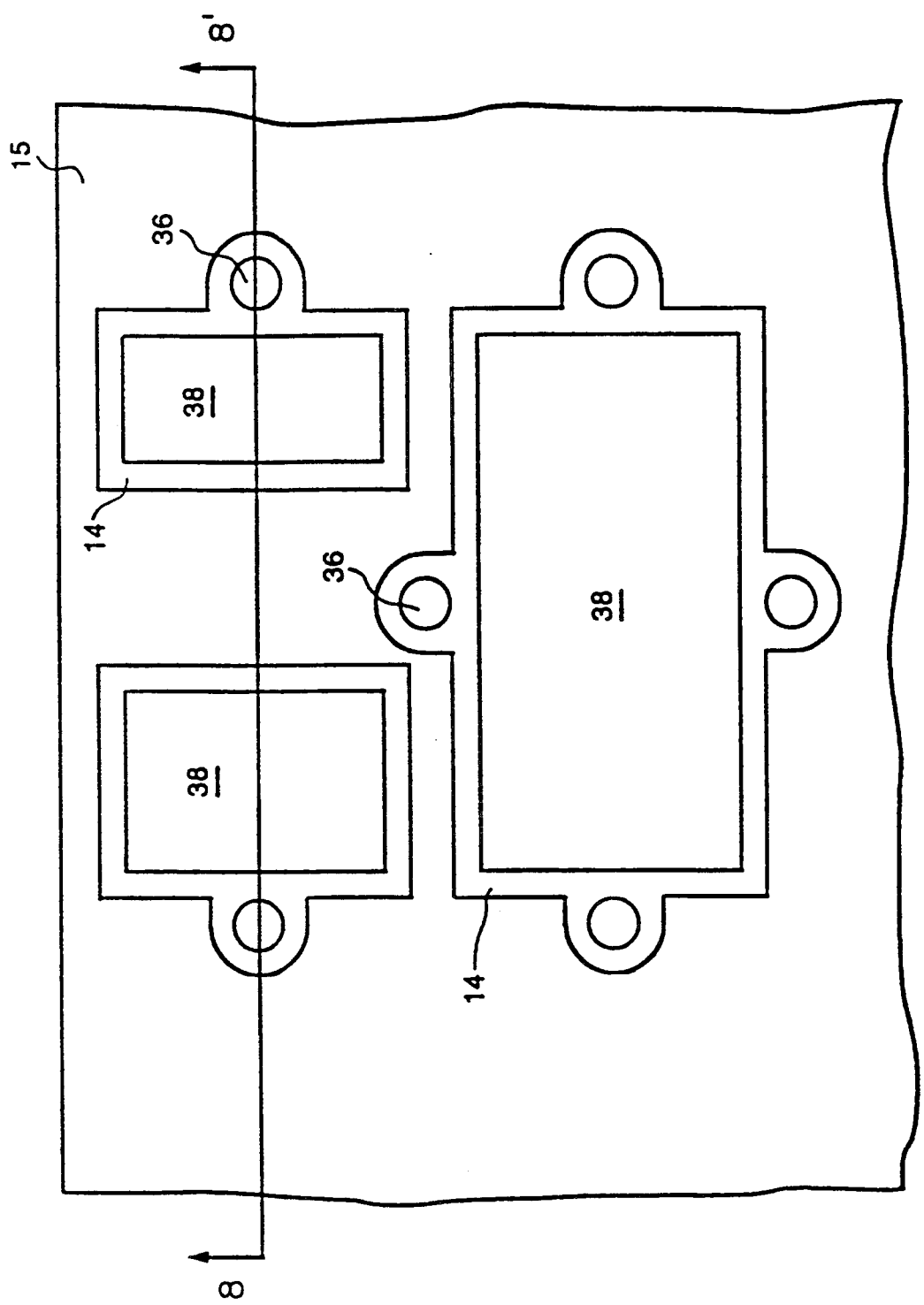
FIG. 9 is a top view of the board layer of FIG. 8.

FIG. 9 is a top view of the board layer of the embodiment of FIG. 8, with FIG. 8 being a view of the AA' axis of FIG. 9. In this embodiment the board layer has three chip openings 38, six electrically conductive through-connections 36, and supports metallization plane 15 on connection surface 14. The gap between through-connections 38 and the metallization plane preferably ranges from 2 to 5 mils, whereas the gap between a metallization plane and a chip opening can be as small as 0 to 2 mils.

Figure 10:
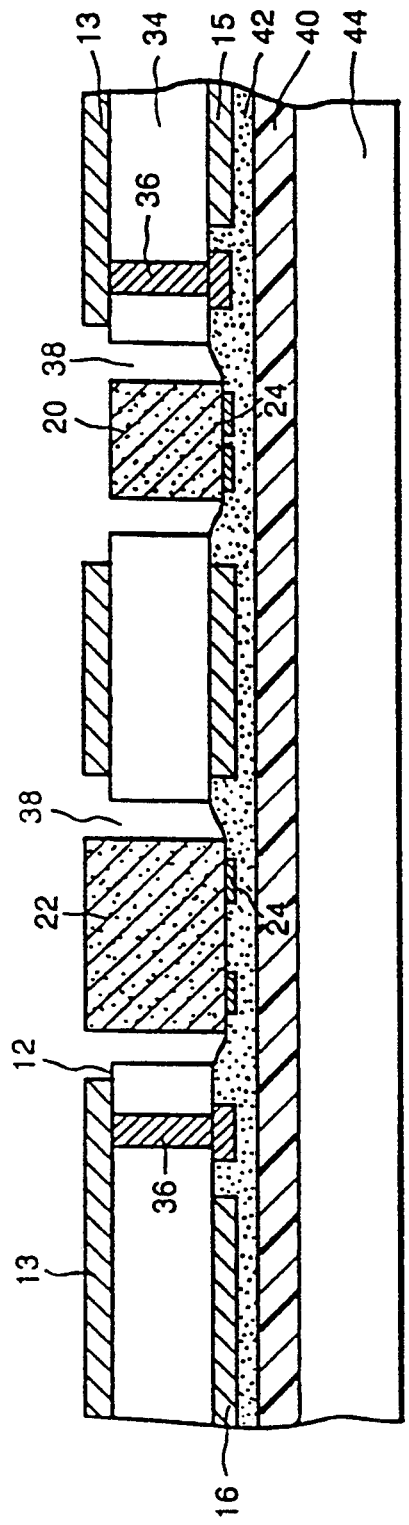
FIG. 10 is a view similar to that of FIG. 8, further showing the board layer over a base dielectric layer and base with chips positioned in the openings of the board layer.

FIG. 10 illustrates, in a view similar to that of FIG. 8, board layer 34 having connection surface 14 positioned on a base dielectric layer 40 covered by an adhesive 42, base dielectric layer 40 being supported by a base 44, with chips 20 and 22 positioned face down in the adhesive through openings 38 of the board layer. Base dielectric layer 40 preferably comprises a material which adheres lightly to base 44 and is compatible with HDI processing, such as Kapton polyimide, for example.

Figure 11:
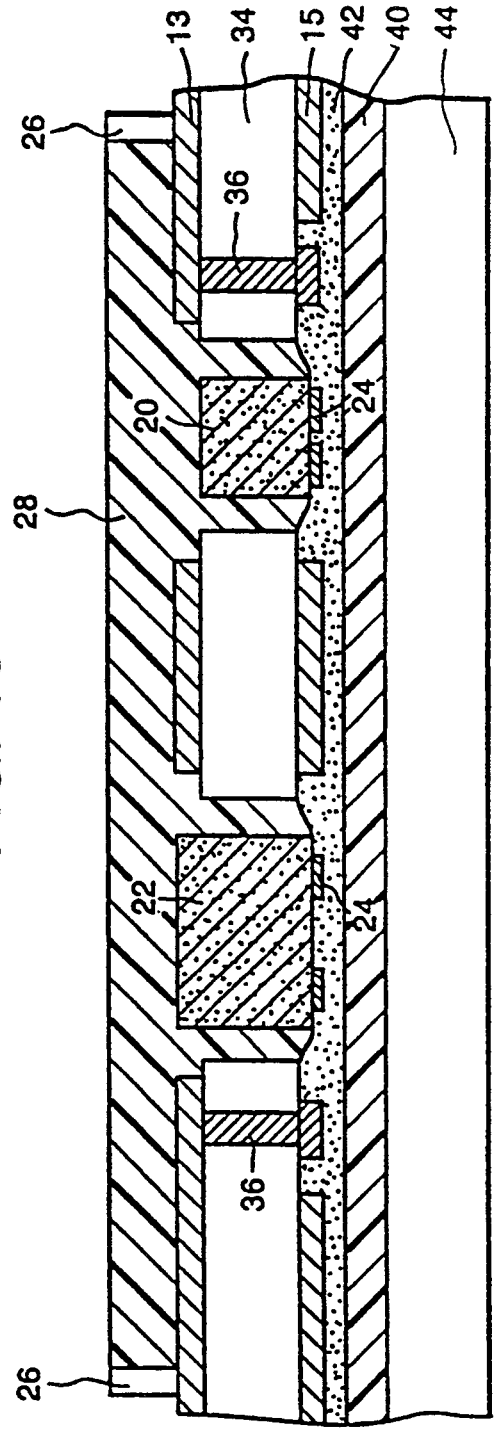
FIG. 11 is a view similar to that of FIG. 10, further showing a mold form situated around the chips and containing substrate molding material.

FIG. 11 shows the structure of FIG. 10 with a mold form 26 o situated around the chips and containing substrate molding material 28. The thickness and type of material are preferably chosen as described with respect to the embodiment of FIG. 5.

Figure 12:
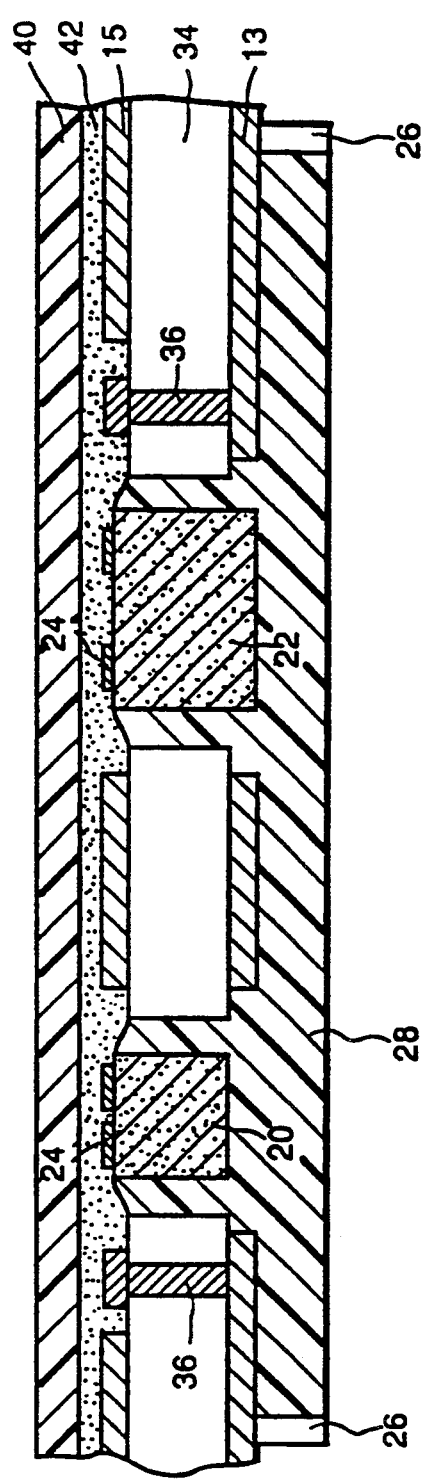
FIG. 12 is a view similar to that of FIG. 11, further showing the structure of FIG. 11 in an inverted position and with the base removed.

FIG. 12 is a view of the structure shown in FIG. 11 after base 44 has been peeled from base dielectric layer 40 and the structure has been inverted.

FIG. 13 shows the structure of FIG. 12 with vias 30 in base dielectric layer 40 aligned with chip pads 24, selected portions of metallization plane 15, and through-connections 36, and a pattern of electrical conductors 32 interconnecting chip pads 24 with metallization planes 13 and 15. The process for fabricating this structure is similar to the process discussed for fabricating the structure shown in FIG. 6. The invention is not limited to the precise sequence of steps discussed with respect to FIGS. 10-13. For example, it is not necessary that base dielectric layer 40 be situated between board layer 34 and base 44 in the structure of FIG. 10; an adhesive can be used alone and base dielectric layer 40 can be applied at a later time before interconnecting the chips.

FIG. 13(a) illustrates, in a view similar to that of FIG. 13, a substrate 52 having a chip well for a chip 62 and with an adhesive 56 situated between the substrate and board layer 34. Substrate 52 may comprise any appropriate structural material, and in one embodiment comprises a ceramic such as alumina. A chip well, which can be provided by any conventional manner, is not required for a chip, such as chip 50, having approximately the same thickness as board layer 34. Chips 62 and 50 are placed face up on the substrate in chip openings 38 and adhesive coated base dielectric layer 40 is then applied. Then vias 30 and a pattern of electrical conductors 32 can be added as described for the structure shown in FIG. 6.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A multi-chip module comprising:
   a substrate;
   a plurality of chips including chip pads thereon and supported on said substrate;
   a dielectric layer over said chips and said substrate, said dielectric layer having a connection surface and a substrate surface, each of said surfaces having a respective metallization plane thereon with plane openings patterned on each of said surfaces, said dielectric layer further containing a plurality of vias, each of said vias being aligned with a predetermined respective one of said chip pads and a predetermined portion of the metallization plane on the substrate surface;

an adhesive layer situated between said substrate and the substrate surface of said dielectric layer; and a pattern of electrical conductors extending through said vias to interconnect selected ones of said chips and selected portions of the metallization planes.

2. The module of claim 1, wherein said dielectric layer comprises a polyimide.

3. The module of claim 2, wherein said substrate comprises a molded plastic.

4. A multi-chip module comprising:

a substrate;

a board layer over said substrate, said board layer having chip openings therein, a connection surface and a substrate surface, each of said surfaces having a respective metallization plane thereon with plane openings patterned on each of said surfaces, and a plurality of conductive through-connections, each of said through-connections being aligned with a predetermined respective portion of the metallization plane on the substrate surface;

an adhesive layer situated between said substrate and the substrate surface of said board layer;

a plurality of chips having chip pads thereon, at least one of said chips being situated in a respective one of said chip openings; and means coupling selected ones of said chip pads to selected portions of the metallization planes.

5. The module of claim 4, wherein said substrate includes at least one chip well therein aligned with a selected one of said chip openings and wherein a respective one of said plurality of chips is situated in said at least one chip well.

6. The module of claim 5, wherein said board layer comprises a material selected from the group consisting of glass epoxy, glass polyimide, and Kevlar polyimide.

7. The module of claim 5, wherein said substrate comprises a plastic.

8. The module of claim 5, wherein the coupling means comprises a base dielectric layer having vias aligned with predetermined respective ones of said chip pads, predetermined respective ones of said through-connections, and predetermined portions of the metallization plane on the connection surface of said board layer; and a pattern of electrical conductors extending through said vias to interconnect said selected ones of said chip pads and said selected portions of the metallization planes.

9. A method of fabricating a multi-chip module on a base comprising the steps of:

applying a dielectric layer over said base, said dielectric layer having a connection surface and a substrate surface, each of said surfaces having a metallization plane thereon with plane openings patterned on each of said surfaces;

placing a plurality of chips thereon having chip pads thereon face down on said dielectric layer through the openings of the metallization plane of the substrate surface on said dielectric layer;

positioning a mold form around said chips;

adding substrate molding material within said mold form;

hardening said substrate molding material;

separating said dielectric layer from said base;

forming vias through said dielectric layer aligned with predetermined respective ones of said chip pads and predetermined portions of the metallization plane on the substrate surface; and coupling selected ones of said chip pads to selected portions of the metallization planes.

10. The method of claim 9, wherein the step of coupling said chip pads to said metallization planes comprises applying a pattern of electrical conductors extending through said vias to interconnect said selected ones of said chips and said selected portions of the metallization planes.

11. A method of fabricating a multi-chip module on a base comprising the steps of:

applying a board layer over said base, said board layer having chip openings, a connection surface and a substrate surface, each of said surfaces having a metallization plane thereon with plane openings patterned on each of said surfaces, and a plurality of through-connections, each of said through-connections being aligned with a predetermined respective portion of the metallization plane on the substrate surface extending though said board layer;

placing a plurality of chips having chip pads thereon face down on said base through said chip openings;

positioning a mold form around said chips;

adding substrate molding material within said mold form;

hardening said substrate molding material;

separating said board layer and said chips from said base; and coupling selected ones of said chip pads to selected portions of the metallization planes.

12. The method of claim 11, wherein the step of coupling said chip pads to said metallization planes comprises:

applying a base dielectric layer over said board layer and said chips;

providing vias in said base dielectric layer aligned with predetermined respective ones of said chip pads, predetermined portions of the metallization plane of the connection surface, and predetermined respective ones of said through-connections; and applying a pattern of electrical conductors extending through said vias to interconnect said selected ones of said chip pads and said selected portions of the metallization planes.

13. The method of claim 11, further including the step of positioning a base dielectric layer coated with an adhesive over said base prior to applying said board layer over said base.

14. The method of claim 13, wherein the step of separating said board layer and said chips from said base comprises separating said board layer and said base dielectric layer from said base; and wherein the step of coupling selected ones of said said chip pads to said metallization planes comprises forming vias through said base dielectric layer aligned with predetermined respective ones of said chip pads, predetermined ones of said through-connections, and predetermined portions of the metallization planes, and applying a pattern of electrical conductors extending through said vias to interconnect said selected ones of said chip pads and said selected portions of the metallization planes.

15. A method of fabricating a multi-chip module including a substrate having chips, comprising the steps of:

applying a dielectric layer over said substrate and said chips, said dielectric layer having a connection surface and a substrate surface, each of said surfaces having a metallization plane thereon with plane openings patterned on each of said surfaces; and forming vias through said dielectric layer aligned with predetermined respective ones of said chip pads and predetermined portions of the metallization plane on the substrate surface; and coupling selected ones of said chip pads to selected portions of the metallization planes.

16. The method of claim 15, wherein the step of coupling said selected ones of said chip pads to selected portions of said metallization planes comprises applying a pattern of electrical conductors extending through said vias to interconnect said selected ones of said chip pads and said selected portions of the metallization planes.

17. A method of fabricating a multi-chip module including a substrate, comprising the steps of:

applying a board layer over said substrate, said board layer having chip openings, a connection surface and a substrate surface, with each of said surfaces having a metallization plane with plane openings patterned on each of said surfaces, and through-connections, each of said through-connections being aligned with a predetermined portion of the metallization plane on the substrate surface extending though said board layer;

placing a plurality of chips having chip pads thereon face up on said substrate through said chip openings;

coupling selected ones of said chip pads to selected ones of the metallization planes.

18. The method of claim 17, wherein said substrate includes at least one chip well therein, said at least one chip well being aligned with a predetermined one of said chip openings and having at least one of said plurality of chips situated therein.

19. The method of claim 18, wherein the step of coupling selected ones of said chip pads to selected ones of the metallization planes comprises:

applying a base dielectric layer over said board layer and said plurality of chips;

providing vias in said base dielectric layer aligned with predetermined respective ones of said chip pads, predetermined portions of the metallization plane on the connection surface, and predetermined respective ones of said through-connections; and applying a pattern of electrical conductors extending through said vias to interconnect said selected ones of said chip pads and said selected portions of the metallization planes.

* * * * *